US012051757B2

(12) United States Patent
Foti et al.

(10) Patent No.: US 12,051,757 B2
(45) Date of Patent: Jul. 30, 2024

(54) OPTIMISED SOLAR CELL, SOLAR CELL MODULE AND METHOD OF MANUFACTURING THEREOF

(71) Applicant: 3SUN S.r.l., Catania (IT)

(72) Inventors: Marina Foti, Rome (IT); Marcello Sciuto, Rome (IT); Alfredo Di Matteo, Rome (IT)

(73) Assignee: 3SUN S.r.l., Catania (IT)

( * ) Notice: Subject to any disclaimer, the term of this patent is extended or adjusted under 35 U.S.C. 154(b) by 71 days.

(21) Appl. No.: 17/618,916

(22) PCT Filed: Jun. 15, 2020

(86) PCT No.: PCT/IT2020/050150
§ 371 (c)(1),
(2) Date: Dec. 14, 2021

(87) PCT Pub. No.: WO2020/250262
PCT Pub. Date: Dec. 17, 2020

(65) Prior Publication Data
US 2022/0310856 A1 Sep. 29, 2022

(30) Foreign Application Priority Data
Jun. 14, 2019 (IT) .................. 102019000009072

(51) Int. Cl.
*H01L 31/0224* (2006.01)
*H01L 31/072* (2012.01)
*H01L 31/18* (2006.01)

(52) U.S. Cl.
CPC .......... *H01L 31/02245* (2013.01); *H01L 31/022433* (2013.01); *H01L 31/072* (2013.01); *H01L 31/186* (2013.01)

(58) Field of Classification Search
CPC .............................. H01L 31/022433
See application file for complete search history.

(56) References Cited

U.S. PATENT DOCUMENTS

2017/0373210 A1* 12/2017 Sato ................ H01L 31/022425

FOREIGN PATENT DOCUMENTS

| JP | 2010027778 A * | 2/2010 | ..... H01L 31/022433 |
| WO | WO 2017/119036 | 7/2017 | |
| WO | WO 2020/109408 | 6/2020 | |

OTHER PUBLICATIONS

English machine translation of JP 2010-027778 A (Year: 2024).*

(Continued)

*Primary Examiner* — Angelo Trivisonno

(57) ABSTRACT

The present invention concerns a bifacial solar cell (1) comprising a front side (10) and a back side (20), said front and back sides (10, 20) having a respective outer layer (34) made of transparent conductive oxide, on which is placed a respective metallization grid (11, 21), each metallization grid (11, 21) comprising first collectors (111, 211) running parallel to each other in a horizontal direction (x) of said solar cell (1) and second collectors (112, 212) crossing said first collectors (111, 211), each second collector (112, 212) comprising two vertical elements (112a, 112b, 212a, 212b) and at least one horizontal element (112c, 212c) every one or two first collectors (111) or 3 or 6 first collectors (211) connecting said two vertical elements (112a, 112b, 212a, 212b), said solar cell module being characterized in that said metallization grids (11, 21) furtherly comprise at least one respective front or back area (113, 213), said front or back area (113, 213) comprising said at least one horizontal element (112c, 212c) and a portion of the underlying outer layer (34) made of transparent conductive oxide, so that a cell connector can be attached to said solar cell (1) by means of an electrically conductive adhesive deposited on said front or back area (113, 213) without needing a physical barrier for said electrically conductive adhesive. The present (Continued)

invention also concerns a solar cell module and a method of manufacturing thereof.

10 Claims, 5 Drawing Sheets

(56) References Cited

OTHER PUBLICATIONS

International Preliminary Report on Patentability Dated May 27, 2021 From the International Preliminary Examining Authority Re. Application No. PCT/IT2020/050150. (12 Pages).
International Search Report and the Written Opinion Dated Sep. 28, 2020 From the International Searching Authority Re. Application No. PCT/IT2020/050150. (12 Pages).
Rapporto di Ricerca e Opinione Scritta [Search Report and Written Opinion] Dated Feb. 4, 2020 From the Ministero dello Sviluppo Economico, Direzione Generale Sviluppo Produttivo e Competitivita, Uffico Italiano Brevetti e Marchi Re. Application No. IT 201900009072. (8 Pages).
Communication Pursuant to Article 94(3) EPC Dated Dec. 20, 2022 From the European Patent Office Re. Application No. 20740423.7. (5 Pages).
Examination Report Under Sections 12 & 13 of the Patents Act, 1970 and the Patents Rules, 2003 Dated Feb. 21, 2023 From the Government of India, Intellectual Property India, Patents, Designs, Trade Marks, Geographical Indications, the Patent Office Re. Application No. 202217000520. (7 Pages).

* cited by examiner

OPTIMISED SOLAR CELL, SOLAR CELL MODULE AND METHOD OF MANUFACTURING THEREOF

RELATED APPLICATIONS

This application is a National Phase of PCT Patent Application No. PCT/IT2020/050150 having International filing date of Jun. 15, 2020, which claims the benefit of priority of Italian Patent Application No. 102019000009072 filed on Jun. 14, 2019. The contents of the above applications are all incorporated by reference as if fully set forth herein in their entirety.

FIELD AND BACKGROUND OF THE INVENTION

The present invention concerns an optimized solar cell. In particular, the present invention concerns a metallization layout for solar cells employed to form a solar cell module and a method of manufacturing thereof.

More specifically, the present invention concerns a metallization layout for bifacial solar cells based on heterojunction technology (HJT), also known as HJT solar cells.

As already known, and as shown in FIG. 1, HJT bifacial solar cells are typically realized by employing a very thin layer of hydrogenated amorphous Silicon (a-Si:H), usually measuring between 10-20 nm, on both sides of a monocrystalline Silicon (c-Si) wafer.

Typically, the c-Si bulk substrate is subject to a texturization process before the deposition of a-Si:H, said c-Si bulk having a resistivity usually between 0.1-10 $\Omega$cm and thickness equal to 180 µm.

The texturization process comprises several different chemical etching steps that allows to remove saw damages, and leads to the formation of pyramids (with an average size between 1÷5 µm) on both the surfaces of the wafer.

In fact, the pyramids allow both to reduce the reflectivity of the surface and to reduce the scattering of the light at small angles, in order to increase the optical path within the wafers.

A-Si:H layers are deposited on both sides of the c-Si wafer to passivate its surface, reducing silicon dangling bonds on the crystalline silicon wafer surface.

The reduction of surface defects results in a reduction of focalized defect levels inside the band-gap of the silicon wafers, which are recombination centers for minority carriers, causing a reduction of the open circuit voltage (Voc).

After passivation, contacts layers are deposited. Specifically, in order to create a PN junction, a p+ layer is deposited on one side [a-Si:H(p)] of the passivated wafer, and a n+ layer is deposited [a-Si:H(n)] on the opposite side.

When n-type c-Si is used, the p-side of the cell can be the backside emitter of the cell, with respect to the direction of sunlight.

Specifically, n-type silicon wafers are usually employed to reach high efficiencies and, in these particular cases, the minority carriers are holes.

The solar cell device can be then completed by depositing a transparent conductive oxide (TCO) layer on the two side of the wafer (typically indium tin oxide, also known as ITO), that is a conductive oxide which acts as metallic contact to collect and to drive charges through the silver metallic grid.

Finally, two different metallization layouts, usually consisting of grids of silver electrodes, are screen printed on the front and on the rear side.

An example of typical metallization layout of the front side has been shown in FIG. 2.

The architecture of the cell can have the emitter on the rear side (in this case, the solar cell will be indicated as a back-emitter solar cell).

The solar cell obtained through the above-described method can then be object of performance measurements.

A typical silver metallic grid comprises horizontal electrodes, also known as fingers F, and vertical electrodes, also known as bus bars BB.

Thanks to the presence of the metallic grids, solar modules can be assembled by connecting together two or more solar cells.

Specifically, bus bars BB are used to collect the current of the cell, allowing the current-voltage (IV) measurement of the cell and the connection of a grid connector, also known as ribbon, for cell to cell connection during the solar module assembling phase.

The number of bus bars in a single solar cell is variable, but usually between 2 and 8.

It is worth to notice that the metallic grid formation is an expensive step due to the use of metals such as silver.

Therefore, prior art documents disclose different optimized layouts with the purpose of saving the silver paste employed for producing a single solar cell.

In particular, the Japanese patent n. JP 5368 022 B2 discloses a metallization layout for a solar cell wherein the bus bar can have openings, in order to save silver paste and suppressing the peeling caused by heat treatment of the solar cell.

Analogously, the European patent n. EP 2 816 609 B1 discloses a bus bar divided in two parallel parts physically separated between each other, respectively a main bus bar and an auxiliary bus bar. In this case, the main bus bar could have openings in order to save silver paste for producing the solar cell, and a ribbon can be glued to the main bus bar by means of a conductive paste. The auxiliary bus bar, on the other hand, was not glued to the ribbon, but acted as a barrier for the aforementioned conductive paste. In fact, according to EP 2 816 609 B1 the auxiliary bus bar is a region where the ribbon may adhere because of processing errors.

However, in this case, the silver paste saved by having a main bus bar with openings was partially used for producing the auxiliary bus bar.

The European patent n. EP 2 704 202 discloses a solar cell wherein the bus bar region can have openings and the ribbon can be glued to the solar cell on a specific ribbon-connected portion, made of non-conductive material, which is an additional layer of the solar cell formed on the dopant layer of the solar cell itself. However, in this case, the total area of the cell exposed to the light decreased because of the presence of said non-conductive material.

Finally, patent applications n. US 2017/0373210 A1 and WO 2017/119036 A1 discloses a solar cell wherein the bus bar region can have openings and the ribbon can be attached to the bus bar by means of an electrically conductive tape, which completely cover said bus bar.

SUMMARY OF THE INVENTION

Therefore, purpose of the present invention is to provide a metallization layout which allows achieving the following effects:
  minimizing electrical resistances;
  maximizing the total area of the cell exposed to light; and
  minimizing the silver paste consumption.

A further purpose of the present invention is to provide a metallization layout wherein a ribbon can be glued to the respective bus bar by means of electrically conductive adhesive (ECA).

In particular, a purpose of the present invention is to provide a metallization layout which furtherly achieves the following effects:
- efficient gluing or soldering of the ribbon with a sufficient peel strength
- minimizing the ECA consumption; and
- having reliable cell electrical performances.

Furtherly, a purpose of the present invention is to provide a bus bar that can be glued to a respective ribbon without the need of an extra layer of non-conductive material and without the need of an auxiliary bus bar which forms a barrier for the adhesive itself.

Further purpose of the present invention is that the aforementioned metallization layout can be applied to different types of solar cells.

Another purpose of the present invention is to provide a method for manufacturing the aforementioned metallization layout.

Finally, a purpose of the present invention is to provide a method for connecting two or more cells by means of ECA.

It is therefore a specific object of the present invention a bifacial solar cell, preferably a HJT solar cell, comprising a front side and a back side, said front and back sides having a respective outer layer made of transparent conductive oxide, on which is placed a respective metallization grid, each metallization grid comprising first collectors running parallel to each other in a horizontal direction of said solar cell and second collectors crossing said first collectors, each second collector comprising two vertical elements and at least one horizontal element, connecting said two vertical elements, said solar cell being characterized in that said metallization grids furtherly comprise at least one respective front or back area, said front or back area comprising said at least one horizontal element and a portion of the underlying outer layer made of transparent conductive oxide, so that a cell connector can be attached to said solar cell by means of an electrically conductive adhesive deposited on said front or back area without needing a physical barrier for said electrically conductive adhesive.

According to the invention, each vertical element may comprise protrusions in correspondence of each first collector, said protrusions horizontally protruding from said vertical elements so as to extend the total horizontal size of said second collectors in order to guarantee reliable current measurements on said solar cell.

According to the invention, each horizontal element which crosses said two vertical elements is preferably placed in correspondence of a respective first collector.

Also, according to the invention, said first collectors on said back side can be triple the number of said first collectors on said front side.

According to the invention, on said front side there can be one horizontal element for each first collector or every two first collectors, and on said back side there can be one horizontal element every three first collectors or every six first collectors.

Finally, according to the invention said back area can be greater in size than said front area.

It is a further specific object of the present invention a solar cell module comprising a first and a second solar cell as described above, said solar cell module comprising a cell connector, said cell connector comprising a first portion connected to said front area of said first solar cell by means of an electrically conductive adhesive, said solar cell connector comprising also a second portion connected to said back area of said second solar cell by means of an electrically conductive adhesive.

Finally, it is a further object of the present invention a method for connecting a first and a second bi-facial solar cell in a solar cell module, each solar cell comprising a front side and a back side, said front and back sides having a respective outer layer made of transparent conductive oxide, on which is placed a metallization grid, each metallization grid comprising first collectors running parallel to each other in a horizontal direction of said solar cell and second collectors crossing said first collectors, each second collector comprising two vertical elements and at least one horizontal element connecting said two vertical elements, said solar cell module comprising furtherly a cell connector, said method being characterized by comprising the following steps:
a) deposit a layer of electrically conductive adhesive on the front side of said first solar cell, in correspondence of said horizontal element, said adhesive covering said horizontal element and a portion of said outer layer comprised between said two vertical elements;
b) deposit a layer of electrically conductive adhesive on the back side of said second solar cell, in correspondence of said horizontal element, said adhesive covering said horizontal element and a portion of said outer layer comprised between said two vertical elements; and
c) attach a first portion of said cell connector to said electrically conductive adhesive deposited in step a) and a second portion of said cell connector to said electrically conductive adhesive deposited in step b), so as to connect said front side of said first solar cell to said back side of said second solar cell.

According to the invention, said electrically conductive adhesive deposited in step a) may not extend beyond said two vertical elements and said electrically conductive adhesive deposited in step b) may extend beyond said two vertical elements.

Finally, according to the invention, said solar cells used in said method can be the solar cells described above.

BRIEF DESCRIPTION OF THE SEVERAL VIEWS OF THE DRAWINGS

The present invention will now be described, for illustrative but not limitative purposes, according to its preferred embodiment, with particular reference to the figures of the accompanying drawings, wherein:

FIG. 3b shows an enlargement of FIG. 3a;

FIG. 4a shows the rear view of a portion of the back side of the solar of FIG. 3a;

FIG. 4b shows an enlargement of FIG. 4a;

DESCRIPTION OF SPECIFIC EMBODIMENTS OF THE INVENTION

Figure 1:
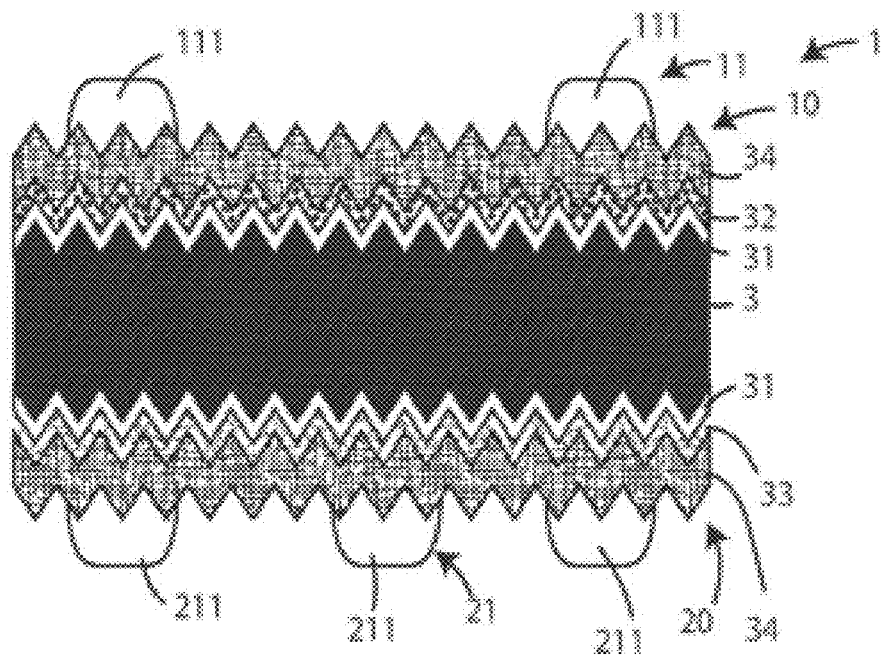
FIG. 1 shows a transversal section of a known HJT solar cell.
Figure 2:
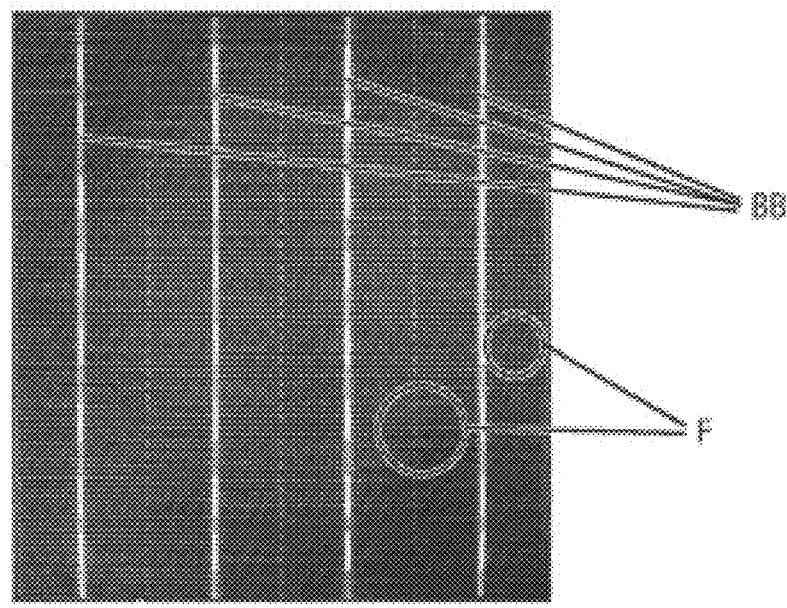
FIG. 2 shows the front view of a known solar cell metallization grid.
Figure 3A:
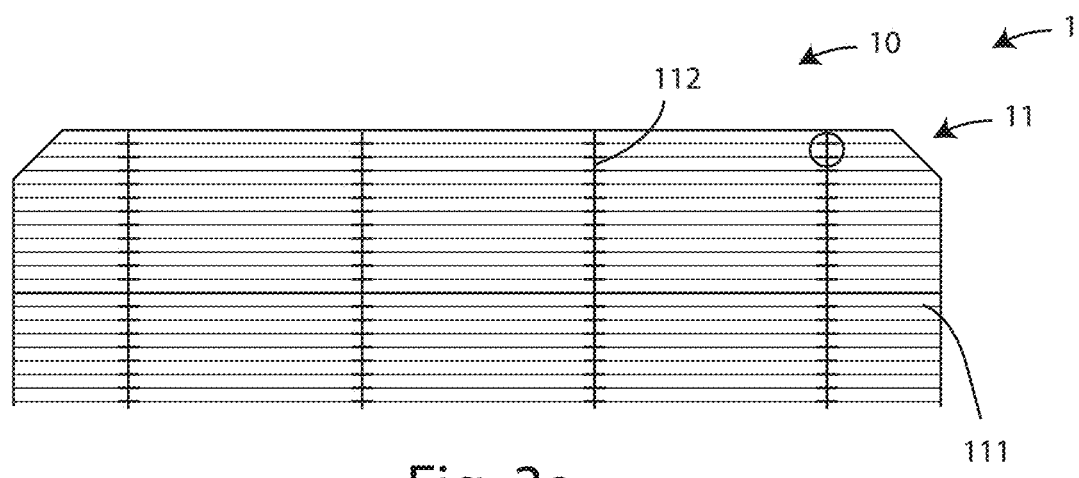
FIG. 3a shows the front view of a portion of the front side of a solar according to the invention.
Figure 3B:
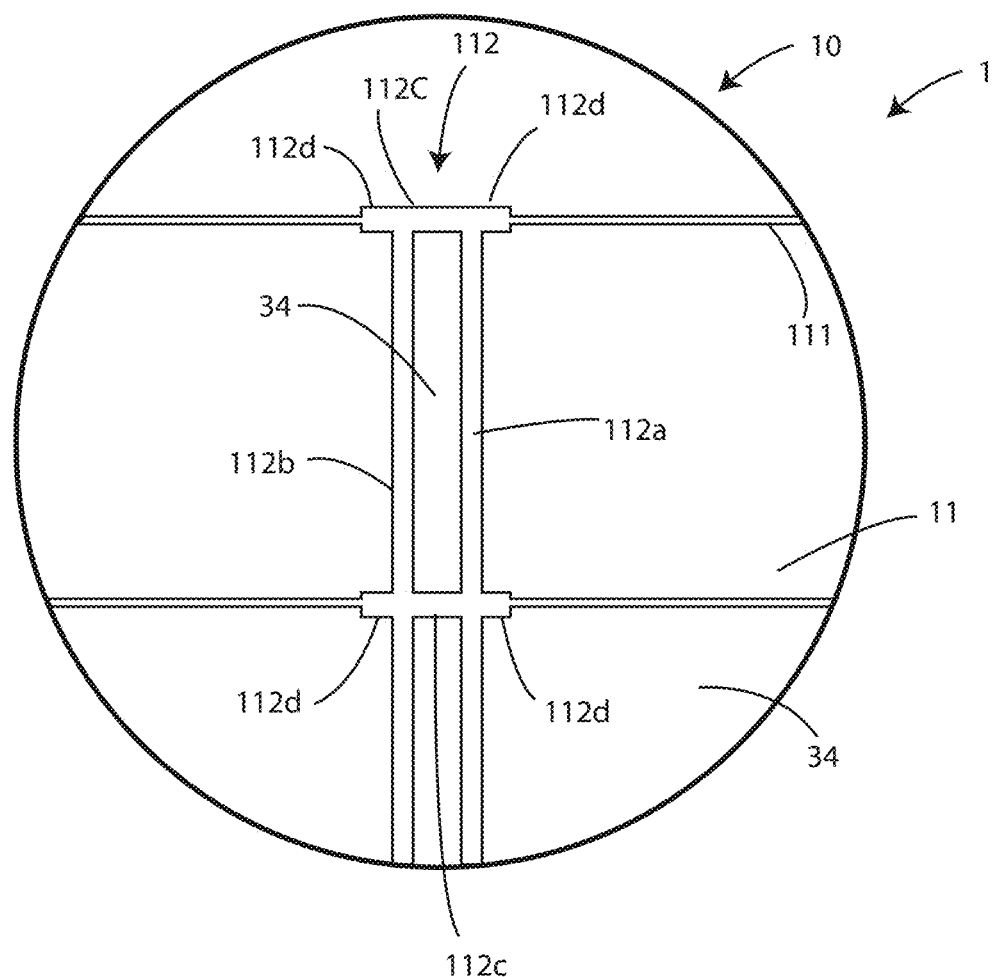
Figure 4A:
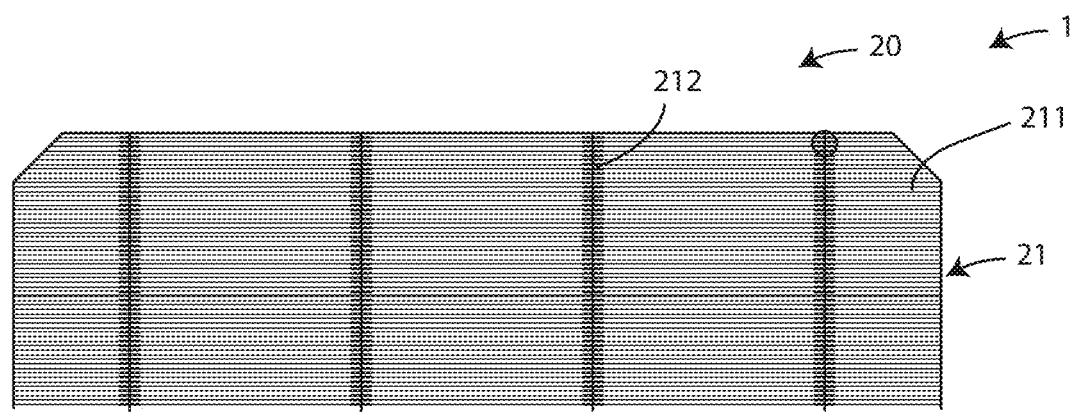
Figure 4B:
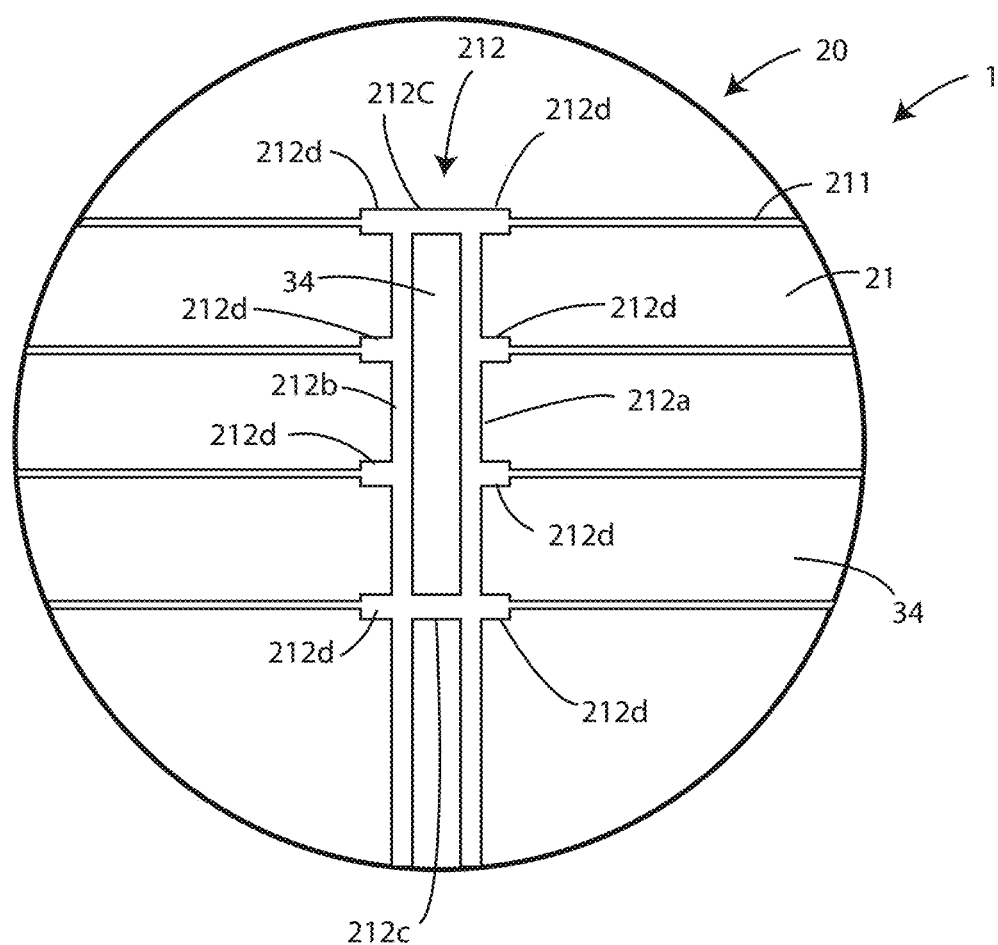
Figure 5:
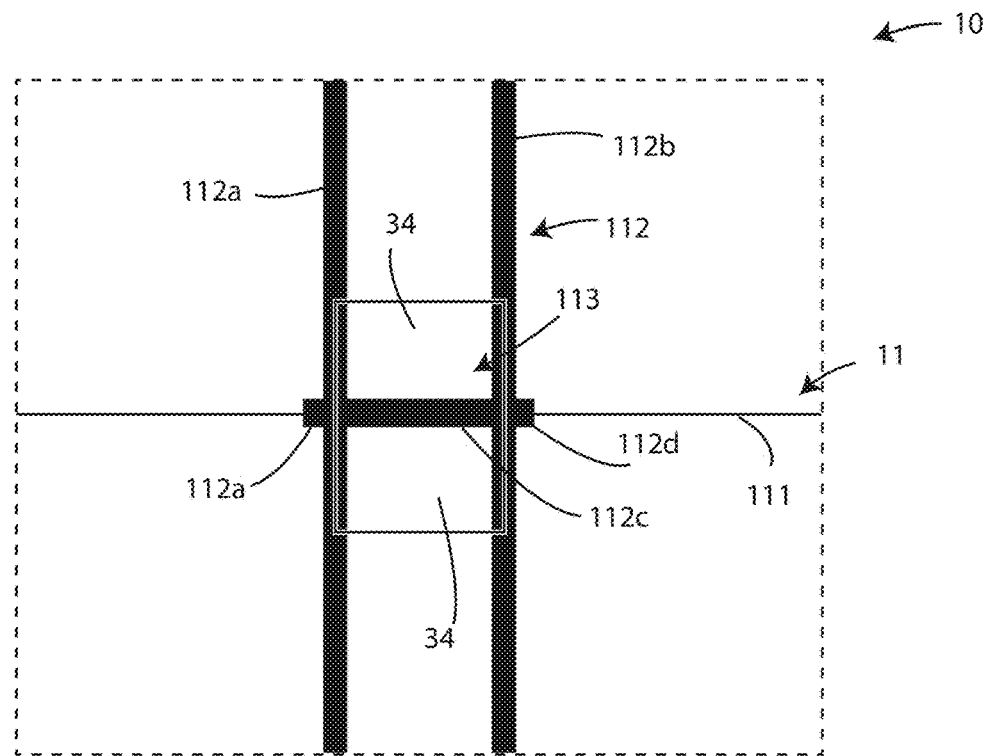
FIG. 5 shows the front view of a portion of the front side of a solar cell according to the invention, wherein has been marked, with a rectangular shape, the front area where an electrically conductive adhesive will be placed according to the present invention.
Figure 6:
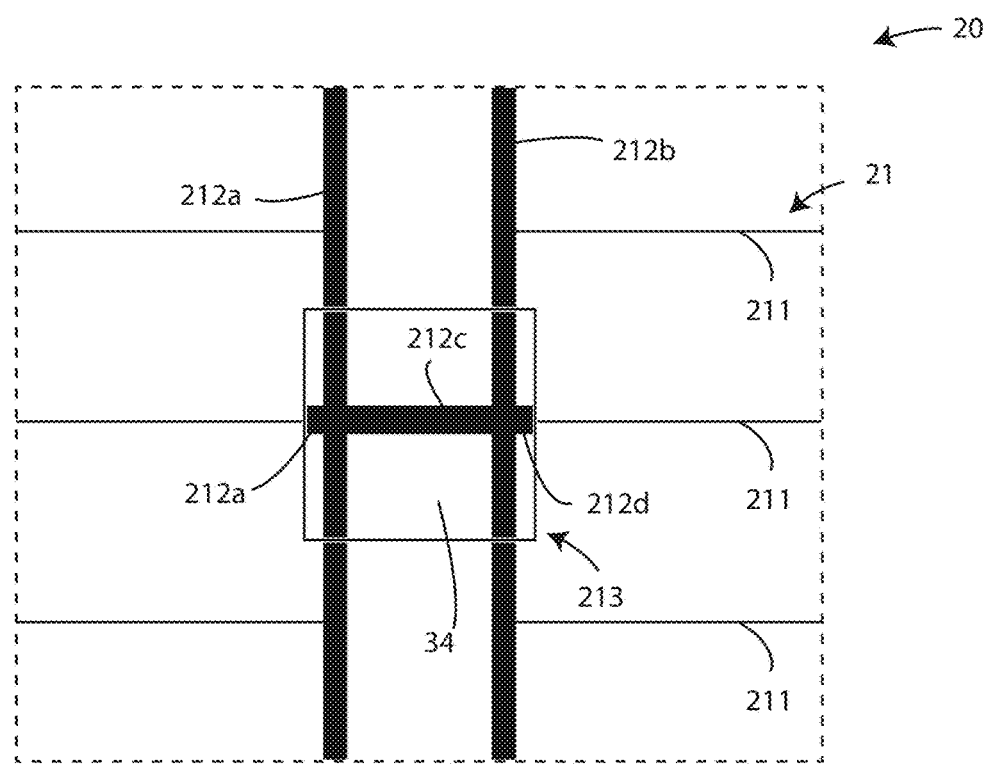
FIG. 6 shows the rear view of a portion of the back side of the solar cell of FIG. 5, wherein has been marked, with a rectangular shape, the back area where an electrically conductive adhesive will be placed according to the invention.
Figure 7:
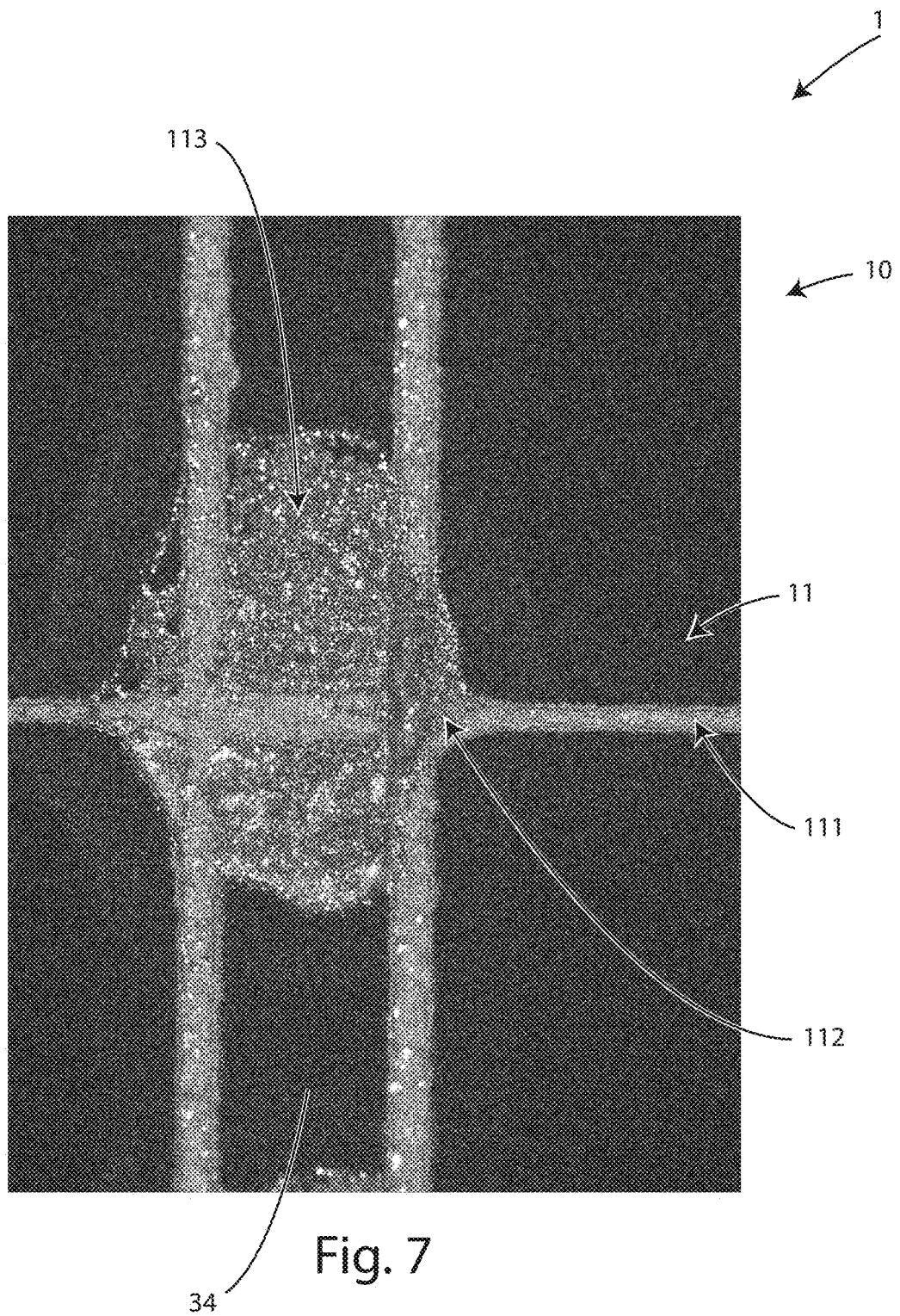
FIG. 7 shows a front view of a portion of the front side of a solar cell according to the invention wherein the electrically conductive adhesive has been already applied, the image was obtained through an optical microscope.

With reference to FIGS. 3-7, a solar cell 1 according to the present invention has a front side 10 and a rear side 20.

The solar cell 1 is preferably a HJT solar cell 1, similar to the HJT solar cells 1 known in the state of the art, comprising a central layer 3 made of c-Si, preferably n-type c-Si, or c-Si(n), two middle layers 31 made of hydrogenated amorphous Silicon a-Si:H, surrounding said central layer 3; a first front layer 32 made of n+ hydrogenated amorphous Silicon a-Si:H(n+) and a first back layer 33 made of p+ hydrogenated amorphous Silicon a-Si:H(p+), in contact with one respective middle layer 31, said first front layer 32 being in correspondence of the front side 10 of the solar cell 1 and said first back layer 33 being in correspondence of the back side 20 of the solar cell 1, both said first front and back layers 32, 33 being covered by an outer layer 34 made of conductive material, preferably TCO.

Each side 10, 20 of the solar cell 1 comprises also a respective external metallization grid 11, 21, comprising first collectors 111, 211, or fingers 111, 211, running parallel to each other in a horizontal direction x of said solar cell.

Preferably, the distance between each finger 111, 211 on the respective side 10, 20 is constant.

In particular, the number of fingers 211 on the back side 20 is greater than the number of fingers 111 on the front side 10, preferably triple, in order to decrease the electrical resistance of the fingers, without excessively limiting the active area of the cell.

Each side 10, 20 of the solar cell 1 comprises also second collectors 112, 212, or bus bars 112, 212, running in a vertical direction y of said solar cell, said vertical direction y being transversal to said horizontal direction x.

Specifically, each bus bar 112, 212 of each side 10, 20 comprises two vertical elements 112a, 112b, 212a, 212b and a plurality of horizontal elements 112c, 212c, or pads 112c, 212c, which connect said two vertical elements 112a, 112b, 212a, 212b.

In particular, each horizontal element 112c, 212c is placed in correspondence of a finger 111, 211. However, on the front side 10 one horizontal element 112c is preferably placed at each finger 111 or every two fingers 111, while on the back side 20 the number of said horizontal elements 212c is less than the number of fingers 211, preferably one third the number of fingers 211, more preferably one horizontal element 211c being placed every three or six fingers 211.

In particular, the preferred distance between two consecutive vertical elements 112a, 112b, 212a, 212b of each bus bar 112, 212 on each side 10, 20 can vary between 0.055-0.065 mm, preferably being equal to 0.6 mm, while the preferred distance between two consecutive pads 112c, 212c on each side 10, 20 is in the range between 1.795-1.805 mm, preferably equal to 1.8 mm.

Furthermore, the preferred distance between two consecutive fingers on the back side is equal to 0.6 mm.

Additionally, each bus bar 112, 212 comprises a plurality of protrusions 112d, 212d, or micro-pads 112d, 212d, which protrude horizontally from said vertical elements 112a, 112b, 212a, 212b, increasing the horizontal size of said bus bars 112, 212.

Preferably, the total horizontal size of each bus bar 112, 212 with said protrusions 112d, 212d is equal to 0.9 mm.

In particular, the horizontal size of each micro-pad 112d, 212d can vary between 0.895-0.905 mm.

Specifically, each bus bar 112, 212 on the front 10 and on the back side 20 of the cell 1 comprises a protrusion 112d, 212d for each finger 111, 211 connected to said bus bar 112, 212.

The above-described layout allows an easy gluing of a cell connector, or ribbon, which connect two adjacent solar cells 1 between each other.

In particular, a ribbon usually connects the front side 10 of a first solar cell 1 to the back side 20 of a second solar cell 1.

In fact, an electrically conductive adhesive, preferably an electrically conductive glue, can be placed on the front side 10 and/or on the back side 20 of the cell in correspondence of each pad 112c, 212c, so as to partially overlap the conductive layer 34 made of TCO underlying the metallization grid.

When such adhesive is placed on the cell 1, it will therefore cover a front area 113 on the front side 10 of the cell 1 and/or a back area 213 on the back side 20 of the cell 1.

Therefore, the cell 1 is provided with non-continuous front areas 113 and back areas 213 and the electrically conductive glue will be deposited in spots on said front areas 113 and/or on said back areas 213 of the cell 1 in a non-continuous way.

In particular, the front areas 113 will be distanced from one another of a first distance and the back areas 213 will be distanced from one another of a second distance.

Therefore, in such configuration, the ribbon will be attached only to said intermittent areas 113, 213 of the cell 1, reducing the total consumption of electrically conductive adhesive, if compared to the use of electrically conductive tape, which completely covers the bus-bar.

The preferred size of the areas 113, 213 covered by electrically conductive adhesive is 0.5×0.7 mm$^2$ for the front side 10 and 0.7×0.7 mm$^2$ for the back side 20 of the cell 1, wherein 0.5 mm and 0.7 mm respectively represent the horizontal and the vertical edges of such areas.

In fact, due to possibly less accurate positioning systems for said electrically conductive adhesive on the back side 20 of the cell 1, the back area 213 covered by electrically conductive adhesive should be greater in size than the front area 113 covered by electrically conductive adhesive.

Advantageously, the proposed shape of the bus bar 112, 212 acts as a pilot hole for the electrically conductive adhesive, limiting the total thickness of a solar cell module made by different stacked layers (e.g. silver contact+ ECA+ ribbon). This also reduces the mechanical stresses induced on the solar cells 1 during the encapsulation process and therefore the possible crack that can be formed on the cells 1. Stress reduction may also lead to a better module reliability during the module life.

Also, said layout advantageously allows maintaining high electrical performances of said solar cells 1. In particular, cell electrical performance measurements can be done by means of a set of micro-tips placed on the bus bars 112, 212 on both sides 10, 20. Specifically, such micro-tips can be placed either on the pads 112c, 212c or on the vertical elements 112b, 212b. In fact, the pads 112c, 212c and vertical elements 112b, 212b sizes have been selected in order to achieve precise measurements also is case of possible tips misalignments.

Therefore, thanks to the proposed metallization layout of the cell, the silver paste consumption can be reduced, maintaining the cell electrical performance.

In fact, in order to have a reliable measurement of the cell 1 electrical performance, a good contact is needed between the tips and the measured bus bar 112, 212, together with an accurate placement of the tips on said bus bar 112, 212.

Therefore, tips size and position on cell 1 have been optimized in order to maintain a good electrical contact between each tip and the aforementioned bus bar 112, 212.

It is worth to notice that the bus bar 112, 212 metallization layout can be applied to different kinds of solar cell 1. Therefore, also the proposed method of gluing a ribbon to the bus bars 112, 212 for connecting together a plurality of solar cells 1 can be applied to different kind of solar cells 1.

However, in case of HJT solar cells 1 such solution is particularly advantageous.

In fact, the adhesion of electrically conductive adhesive performs better on TCO rather than on silver paste. Such better adhesion results in better peel strength within limited areas 113, 213 of the cell 1.

Furthermore, because of such better adhesion the adhesive consumption can be reduced, leading to a reduction of the production costs. In fact, electrically conductive adhesive usually comprises silver, and is therefore an expensive element. The good adhesion of ECA on TCO, allowed by the proposed metallization layout, advantageously does not require any kind of physical barrier for the adhesive, such as the presence of a separated auxiliary bus bar made of two additional external vertical lines surrounding the main bus bar 112, 212. Therefore, the proposed layout does not lead to any interruption of the current, and reduces the overall resistance of the cell 1. Furthermore, such good adhesion does not require the presence of any extra non-conductive layer in the solar cell 1, maximizing the areas exposed to light.

EXAMPLE 1

The above described metallization layout was tested on HJT solar cells 1 and solar cell modules. The following results were obtained:
- comparable solar cell 1 and solar cell module performance to other known HJT cell;
- reduced silver consumption, of at least 10%, if compared with other known HJT cells;
- reliable cell electrical performance measurement (with appropriate tool settings); and
- reliable peel strength after ribbon adhesion.

The tests were made on a large number of solar cells 1 (more than 50,000 solar cells were processed with good electrical performances).

The measured peel force of a ribbon attached on said front or back areas 113, 213 by means of said electrically conductive adhesive was always greater than 1 N/mm. This value is comparable with values obtained on straight bus bars or straight ECA dispensing.

The present invention has been described for illustrative but not limitative purposes, according to its preferred embodiment, but it is to be understood that variations and/or modifications can be made by those skilled in the art without departing from the scope of the claims, as defined by the annexed claims.

The invention claimed is:

1. Solar cell module comprising a first and a second bi-facial solar cell (1),
   each solar cell (1) comprising a front side (1.0) and a back side (20), said front and back sides (10, 20) having a respective outer layer (34) made of transparent conductive oxide, on which is placed a respective metallization grid (11, 21), each metallization grid (11, 21) comprising
   first collectors (1.11, 211) running parallel to each other in a horizontal direction (x) of said solar cell (1), and
   second collectors (112, 212) crossing said first collectors (111, 211), each second collector (112, 212) comprising two vertical elements (112a, 112b, 212a, 212b) and at least one horizontal element (112c, 212c), connecting said two vertical elements (112a, 112b, 212a, 212b),
   wherein said metallization grid (11, furtherly comprises respective front or back areas (113, 213), said front or back areas (113, 213) comprising portions of said two vertical elements (112a, 112b, 212a, 212b) and said at least one horizontal element (112c, 212c), wherein said at least one horizontal element (112c, 212c) crosses said two vertical elements (112a, 112b, 212a, 212b) within said front or back areas (113, 213), and comprising a portion of the underlying outer layer (34) made of transparent conductive oxide, wherein said front or back areas (113, 213) are apart from each other of a distance, said solar cell module being characterised in that
   it comprises a cell connector, said cell connector comprising a first portion connected in a non-continuous way to said front areas (113) of said first solar cell (1) by means of an electrically conductive adhesive deposited in first spots on said front areas (113) in a non-continuous way, wherein each first spot of said first spots is deposited on a respective front area, and wherein said front areas (113) are distanced from one another of a first distance, said cell connector comprising also a second portion connected in a non-continuous way to said back areas (213) of said second solar cell (1) by means of an electrically conductive adhesive deposited in second spots on said back areas (213) in a non-continuous way, wherein each second spot of said second spots is deposited on a respective back area of said back areas (213), and wherein said back areas (213) are distanced from one another of a second distance, wherein said back area (213) and said front area (113) are covered by said electrically conductive adhesive, and said back area (213) is greater in size than said front area (113).

2. Solar cell module according to claim 1, characterized in that each vertical element (112a, 112b, 212a, 212b) comprises protrusions (112d, 212d) in correspondence of each first collector (111, 211), said protrusions (112d, 212d) horizontally protruding from said vertical elements (112a, 112b, 212a, 212b) so as to extend the total horizontal size of said second collectors (112, 212) in order to guarantee reliable current measurements on said solar cell (1).

3. Solar cell module according to claim 1, characterized in that said solar cell (1) is a HJT solar cell.

4. Solar cell module according to claim 1, characterized in that each horizontal element (112c, 212c) crosses said two vertical elements (112a, 112b, 212a, 212b) and is placed in correspondence of a respective first collector (111, 211).

5. Solar cell module according to claim 1, characterized in that said first collectors (211) on said back side (20) are triple the number of said first collectors (111) on said front side (10).

6. Solar cell module according to claim 1, characterized in that on said front side (10) there is one horizontal element (112c) for each first collector (111) or every two first collectors (111).

7. Solar cell module according to claim 1, characterized in that on said back side (20) there is one horizontal element (212c) every three first collectors (211) or every six first collectors (211).

8. Method for connecting a first and a second bi-facial solar cells (1) in a solar cell module, each solar cell (1) comprising a front side (10) and a back side (20); said front and back sides (10, 20) having a respective outer layer (34) made of transparent conductive oxide, on which is placed a metallization grid (11, 21), each metallization grid (11, 21) comprising first collectors (111, 211) running parallel to each other in a horizontal direction (x) of said solar cell (1) and second collectors (112, 212) crossing said first collectors (111, 211), each second collector (112, 212) comprising two vertical elements (112a, 112b, 212a, 212b) and at least one horizontal element (112c, 212c) connecting said two vertical elements (112a, 112b, 212a, 212b), said metallization grid (11, 21) comprising respective front or back areas (113, 213), said front or back areas (113, 213) comprising portions of said two vertical elements (112a, 112b, 212a, 212b) and said at least one horizontal element (112c, 212c), wherein said at least one horizontal element (112c, 212c) crosses said two vertical elements (112a, 112b, 212a, 212b) within said front or back areas (113, 213), and comprising a portion of the underlying outer layer (34) made of transparent conductive oxide, wherein said front or back areas (113, 213) are apart from each other of a distance, wherein said front areas (113) are distanced from one another of a first distance and said back areas (213) are distanced from one another of a second distance, said solar cell module comprising furtherly a cell connector, said method being characterized by comprising the following steps:

a) deposit first spots of electrically conductive adhesive on the front side (10) of said first solar cell (1) in a non-continuous way, each first spot of said first spots being deposited in correspondence of a respective front area of said front areas (113);

b) deposit second spots of electrically conductive adhesive on the back side (20) of said second solar cell (1) in a non-continuous way, each second spot of said second spots being deposited in correspondence of a respective back area of said back areas (213), said back areas (213) and said front areas (113) being covered by said electrically conductive adhesive, and said back areas (213) being greater in size than said front areas (113);

c) attach a first portion of said cell connector to said electrically conductive adhesive deposited in step a) and a second portion of said cell connector to said electrically conductive adhesive deposited in step b), so as to connect said front side (10) of said first solar cell (1) to said back side (20) of said second solar cell (1).

9. Method according to claim 8, characterized in that said electrically conductive adhesive deposited in step a) does not extend beyond said two vertical elements (112a, 112b).

10. Method according to claim 8, characterized in that said electrically conductive adhesive deposited in step b) extends beyond said two vertical elements (212a, 212b).

* * * * *